(12) United States Patent
Ueno et al.

(10) Patent No.: US 11,473,751 B2
(45) Date of Patent: Oct. 18, 2022

(54) VEHICLE LUMINAIRE AND VEHICLE LIGHTING TOOL

(71) Applicant: Toshiba Lighting & Technology Corporation, Yokosuka (JP)

(72) Inventors: Misaki Ueno, Ehime-ken (JP); Kiyokazu Hino, Ehime-ken (JP)

(73) Assignee: Toshiba Lighting & Technology Corporation, Yokosuka (JP)

( * ) Notice: Subject to any disclaimer, the term of this patent is extended or adjusted under 35 U.S.C. 154(b) by 0 days.

(21) Appl. No.: 17/403,438

(22) Filed: Aug. 16, 2021

(65) Prior Publication Data

US 2022/0128211 A1     Apr. 28, 2022

(30) Foreign Application Priority Data

Oct. 27, 2020   (JP) .............................. JP2020-179742
Dec. 21, 2020   (JP) .............................. JP2020-211310

(51) Int. Cl.
*F21S 43/20*     (2018.01)
*F21V 29/507*    (2015.01)
*F21S 43/14*     (2018.01)
*F21S 41/19*     (2018.01)
*F21S 43/19*     (2018.01)

(52) U.S. Cl.
CPC ............. *F21S 43/26* (2018.01); *F21S 41/192* (2018.01); *F21S 43/14* (2018.01); *F21S 43/195* (2018.01); *F21V 29/507* (2015.01)

(58) Field of Classification Search
CPC .......... F21S 43/26; F21S 43/14; F21S 41/192; F21S 43/195; F21V 29/507
See application file for complete search history.

(56) References Cited

U.S. PATENT DOCUMENTS

| 2005/0221519 A1 | 10/2005 | Leung et al. |
| 2005/0280014 A1 | 12/2005 | Park et al. |
| 2007/0205425 A1 | 9/2007 | Harada |
| 2011/0241028 A1* | 10/2011 | Park ...................... H01L 33/483 257/E33.056 |
| 2014/0291716 A1* | 10/2014 | Ukawa ................... H01L 33/56 257/98 |
| 2015/0023016 A1* | 1/2015 | Ishihara .................. H01L 33/62 362/241 |

(Continued)

FOREIGN PATENT DOCUMENTS

| EP | 3663640 A1 | 6/2020 |
| JP | 2016-195099 A | 11/2016 |
| KR | 10-2008-0028099 A | 3/2008 |

*Primary Examiner* — Bryon T Gyllstrom
*Assistant Examiner* — Christopher E Dunay
(74) *Attorney, Agent, or Firm* — Banner & Witcoff, Ltd.

(57) ABSTRACT

According to an embodiment, there is provided a vehicle luminaire including: a socket; a board provided on one end side of the socket; at least one light-emitting element provided on the board; a frame part provided on the board to surround the light-emitting element; a sealing part that is provided on an inner side of the frame part and contains a resin; and an optical element provided on the sealing part. The frame part includes at least any one of a trap provided on an outer surface to retain at least a part of the resin overflowed to an outer side of the frame part, and an inclined surface provided in an edge of an opening opposite to the board side.

14 Claims, 8 Drawing Sheets

(56) References Cited

U.S. PATENT DOCUMENTS

| | | | |
|---|---|---|---|
| 2015/0338067 A1* | 11/2015 | Sasaki | H04B 1/034 |
| | | | 362/311.04 |
| 2016/0290587 A1 | 10/2016 | Nakagawa et al. | |
| 2018/0004040 A1* | 1/2018 | Kuramoto | F21V 5/02 |
| 2018/0052275 A1* | 2/2018 | Lee | G02B 6/0055 |
| 2019/0267518 A1* | 8/2019 | Hino | H01L 33/54 |

\* cited by examiner

FIG. 10

VEHICLE LUMINAIRE AND VEHICLE LIGHTING TOOL

CROSS-REFERENCE TO RELATED APPLICATIONS

This application is based upon and claims the benefit of priority from Japanese Patent Application No. 2020-179742, filed on Oct. 27, 2020; No. 2020-211310, filed on Dec. 21, 2020; the entire contents of which are incorporated herein by reference.

FIELD

Embodiments described herein relate to a vehicle luminaire and a vehicle lighting tool.

BACKGROUND

From the viewpoints of energy saving, a long operational lifespan, and the like, a vehicle luminaire equipped with a light-emitting diode is becoming widespread instead of a vehicle luminaire equipped with a filament.

For example, the vehicle luminaire is provided with a socket, a light-emitting module provided on one end side of the socket, and a plurality of power-supply terminals which are electrically connected to the light-emitting module. For example, the light-emitting module includes a board including a wiring pattern, and a light-emitting diode (LED) that is provided on the board and is electrically connected to the wiring pattern. Each of the plurality of power-supply terminals is soldered to a connection pad provided in the wiring pattern.

In addition, in recent years, a reduction in size of the light-emitting module, and a reduction in size of a vehicle luminaire are desired. Accordingly, there is suggested a light-emitting module including a chip-shaped light-emitting diode, a frame part that surrounds the chip-shaped light-emitting diode, a sealing part that is provided on an inner side of the frame part and covers the chip-shaped light-emitting diode, and an optical element that is provided on the sealing part. In the light-emitting module, the sealing part is formed by filling the inner side of the frame part with a resin having translucency. The optical element is placed on the resin configured to fill the inner side of the frame part.

Here, when placing the optical element on the resin, there is a concern that a gas such as the air may be trapped between the optical element and the resin. When the resin is cured in a state in which the gas is trapped, a gas-containing layer, a void (air bubble), or the like may occur between the sealing part and the optical element, or at the inside of the sealing part. When the gas-containing layer, the void, or the like exists, there is a concern that light emitted from a light-emitting diode is reflected from the gas-containing layer or an interface of the void or the like, and light extracting efficiency may decrease.

Accordingly, when placing the optical element on the resin configured to fill the inner side of the frame part, the resin is caused to overflow to an outer side of the frame part. In this case, it is possible to discharge the gas trapped between the optical element and the resin in combination with the resin, and thus it is possible to suppress the gas-containing layer, the void, or the like from occurring. In this case, when the amount of resin overflowing to the outer side of the frame part increases, discharging of the gas becomes easy.

By the way, the resin overflowed to the outer side of the frame part has a certain degree of fluidity, and thus the overflowed resin flows on the board, and there is a concern that the resin adheres to, for example, the connection pad provided in the wiring pattern. Since the power-supply terminals are soldered to the connection pad, when the resin adheres to the connection pad, it is difficult to solder the power-supply terminals to the connection pad.

In addition, when manufacturing the light-emitting module, the resin configured to fill the inner side of the frame part is heated and cured, thereby performing formation of the sealing part and joining of the optical element.

Accordingly, when heating and curing the resin, thermal stress occurs. In addition, since heat is generated when the light-emitting diode is lighted, the sealing part is heated and thermal stress is generated. In the case of the vehicle luminaire, since lighting and extinction are repetitively performed, the thermal stress is repetitively generated.

Here, in the sealing part, the vicinity of a peripheral edge of an end face opposite to a board side is provided at a portion where an inner surface of the frame part and the optical element intersect each other. Therefore, in the sealing part, the peripheral edge of the end face opposite to the board side has a sharp angle, and thus stress concentration is likely to occur. If stress concentration occurs, when manufacturing the light-emitting module or during use of the vehicle luminaire, in the vicinity of an edge of an opening opposite to the board side in the frame part, a damage such as cracks and peeling-off may occur in the sealing part. When the damage occurs in the sealing part, there is a concern that optical characteristics may vary.

DETAILED DESCRIPTION

A vehicle luminaire according to an embodiment includes a socket; a board provided on one end side of the socket; at least one light-emitting element provided on the board; a frame part provided on the board to surround the light-emitting element; a sealing part that is provided on an inner side of the frame part and contains a resin; and an optical element provided on the sealing part. The frame part includes at least one of a trap that is provided on an outer surface and retains at least a part of the resin overflowed to an outer side of the frame part, and an inclined surface provided in an edge of an opening opposite to the board side.

Hereinafter, the embodiment will be described with reference to the accompanying drawings. Note that, in the drawings, the same reference numeral will be given to the same constituent element, and detailed description thereof will be appropriately omitted.

Vehicle Luminaire

A vehicle luminaire 1 according to this embodiment can be installed, for example, in an automobile, a railway vehicle, and the like. Examples of the vehicle luminaire 1 installed in the automobile include luminaires capable of being used as a front combination light (for example, an appropriate combination of a daylight running lamp (DRL), a position lamp, a turn signal lamp, and the like), a rear combination light (for example, an appropriate combination of a stop lamp, a tail lamp, a turn signal lamp, a back lamp, a fog lamp, and the like), and the like. However, the use of the vehicle luminaire 1 is not limited thereto.

Figure 1:
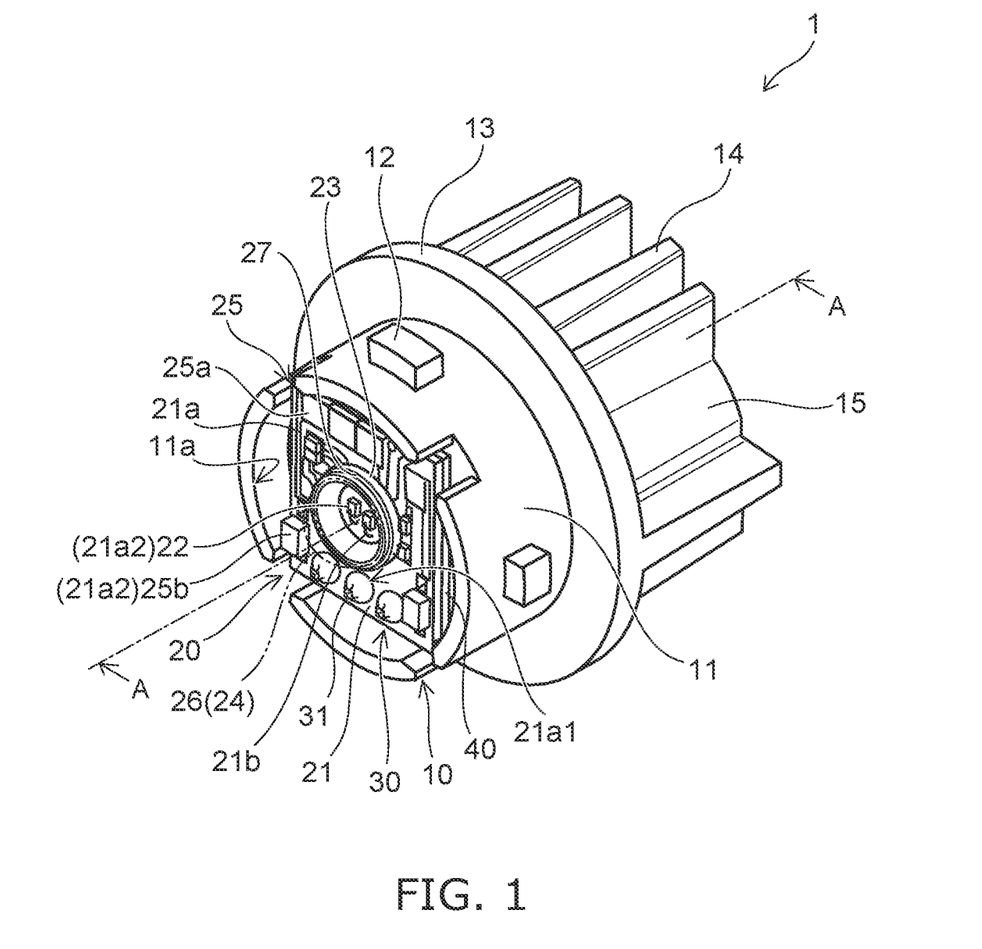
FIG. 1 is a schematic perspective view illustrating a vehicle luminaire according to this embodiment.

FIG. 1 is a schematic perspective view illustrating the vehicle luminaire 1 according to this embodiment.

Figure 2:
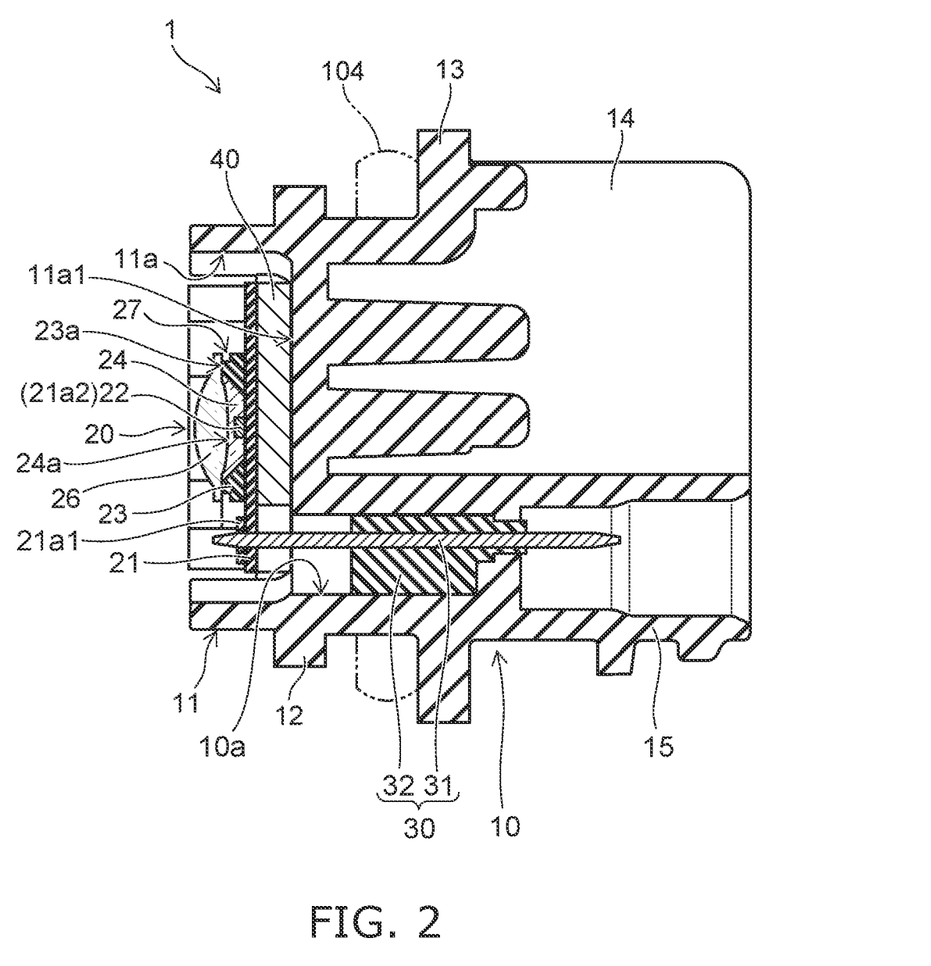
FIG. 2 is a cross-sectional view taken along line A-A in the vehicle luminaire illustrated in FIG. 1.

FIG. 2 is a cross-sectional view taken along line A-A in the vehicle luminaire 1 illustrated in FIG. 1.

Figure 3:
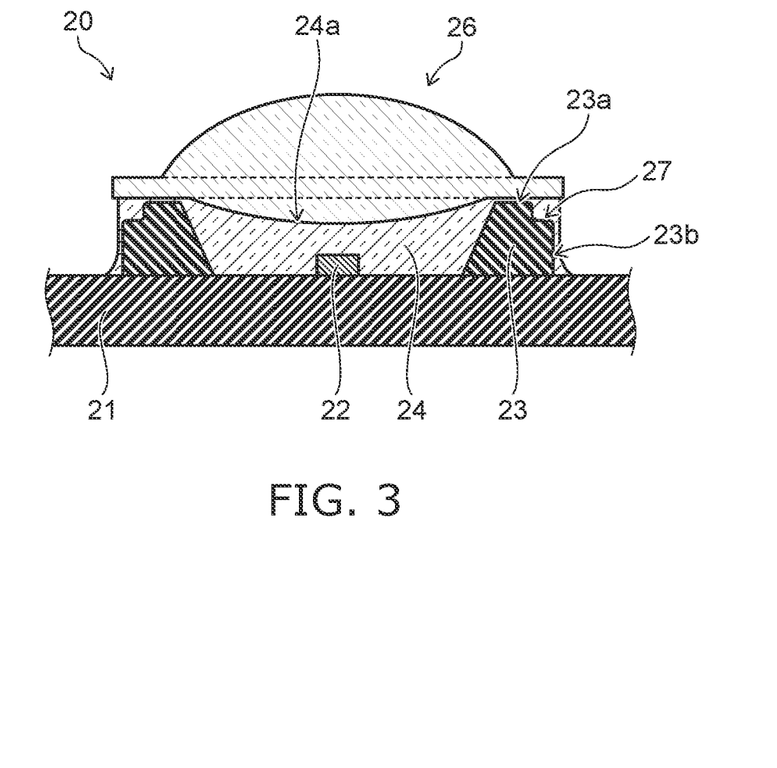
FIG. 3 is a schematic cross-sectional view of a light-emitting module.

FIG. 3 is a schematic cross-sectional view of a light-emitting module 20.

As illustrated in FIG. 1 and FIG. 2, for example, a socket 10, the light-emitting module 20, a power-supply part 30, and a heat transfer part 40 can be provided in the vehicle luminaire 1.

For example, the socket 10 includes a mounting part 11, a bayonet 12, a flange 13, a thermal radiation fin 14, and a connector holder 15.

The mounting part 11 is provided on a surface of the flange 13 on a side opposite to a side in which the thermal radiation fin 14 is provided. An external shape of the mounting part 11 can be set as a columnar shape. For example, the external shape of the mounting part 11 is a circular column shape. The mounting part 11 includes a concave part 11a that opens to an end face opposite to the flange 13 side.

The bayonet 12 is provided on an outer surface of the mounting part 11. The bayonet 12 protrudes toward an outer side of the vehicle luminaire 1. The bayonet 12 faces the flange 13. A plurality of the bayonets 12 are provided. The bayonet 12 can be used when mounting the vehicle luminaire 1 to a housing 101 of a vehicle lighting tool 100. The bayonet 12 can be used in twist-lock.

The flange 13 has a plate shape. For example, the flange 13 has a circular disc shape. An outer surface of the flange 13 is located on an outer side of the vehicle luminaire 1 in comparison to an outer surface of the bayonet 12.

The thermal radiation fin 14 is provided on a side of the flange 13 which is opposite to the mounting part 11 side. At least one of the thermal radiation fin 14 can be provided. A plurality of thermal radiation fins are provided in the socket 10 illustrated in FIG. 1 and FIG. 2. A plurality of the thermal radiation fins 14 can be provided in parallel in a predetermined direction. Each of the thermal radiation fins 14 can be set to have a plate shape.

The connector holder 15 can be provided on a side of the flange 13 which is opposite to the mounting part 11 side. The connector holder 15 can be provided in parallel to the thermal radiation fin 14. The connector holder 15 can be provided in the vicinity of a peripheral edge of the flange 13. The connector holder 15 has a tubular shape, and a connector 105 including a sealing member 105a on an inner side can be inserted into the connector holder 15.

The socket 10 has a function of holding the light-emitting module 20 and the power-supply part 30, and a function of transferring heat generated in the light-emitting module 20 to the outside. Accordingly, it is preferable that the socket 10 is formed from a material having high heat conductivity. For example, the socket 10 can be formed from a metal such as an aluminum alloy.

In addition, in recent years, the socket 10 is desired to efficiently radiate heat generated in the light-emitting module 20 and to be light in weight. Accordingly, the socket 10 is preferably formed from a highly heat conductive resin. For example, the highly heat conductive resin includes a resin and a filler using an inorganic material. For example, the highly heat conductive resin can be set as a material obtained by mixing a filler using carbon, aluminum oxide, or the like in a resin such as polyethylene terephthalate (PET) and nylon.

When the socket 10 contains the highly heat conductive resin, and the mounting part 11, the bayonet 12, the flange 13, the thermal radiation fins 14, and the connector holder 15 are integrally molded, heat generated in the light-emitting module 20 can be efficiently radiated. In addition, the weight of the socket 10 can be reduced. In this case, the mounting part 11, the bayonet 12, the flange 13, the thermal radiation fin 14, and the connector holder 15 can be integrally molded by using an injection molding method or the like. In addition, the socket 10 and the power-supply part 30 can also be integrally molded by using an insert molding method or the like.

The power-supply part 30 includes a plurality of power-supply terminals 31 and a holding part 32.

The plurality of power-supply terminals 31 can be set to have a rod-shaped body. The plurality of power-supply terminals 31 can be provided in parallel in a predetermined direction. One end of each of the plurality of power-supply terminals 31 protrudes from a bottom surface 11a1 of the concave part 11a. The one end of the power-supply terminal 31 is soldered to each of a plurality of connection pads (lands) 21a1 to be described later. The other end of each of the plurality of power-supply terminals 31 is exposed to the inside of a hole of the connector holder 15. The connector 105 can be fitted to the plurality of power-supply terminals 31 exposed to the inside of the hole of the connector holder 15. For example, the plurality of power-supply terminals 31 can be formed from a metal such as a copper alloy. Note that, the shape, the arrangement, the material, the number, and the like of the plurality of power-supply terminals 31 are not limited to the exemplified configurations, and can be appropriately changed.

As described above, it is preferable that the socket 10 is formed from a material having high heat conductivity. However, the material having high heat conductivity may have electric conductivity. For example, a metal such as an aluminum alloy, a highly heat conductive resin including a filler formed from carbon, and the like have electric conductivity. Accordingly, the holding part 32 is provided for insulation between the plurality of power-supply terminals 31 and the socket 10 having electric conductivity. In addition, the holding part 32 also has a function of holding the plurality of power-supply terminals 31. Note that, when the socket 10 is formed from a highly heat conductive resin (for example, a highly heat conductive resin containing a filler formed from an aluminum oxide, or the like) having insulation properties, the holding part 32 can be omitted. In this case, the socket 10 holds the plurality of power-supply terminals 31. The holding part 32 can be formed from a resin having insulation properties. For example, the holding part 32 can be pressed into the hole 10a provided in the socket 10, or can be bonded to an inner wall of the hole 10a.

For example, the heat transfer part 40 is provided between the board 21 and the bottom surface 11a1 of the concave part 11a. For example, the heat transfer part 40 can be bonded to the bottom surface 11a1 of the concave part 11a. As adhesive that bonds the heat transfer part 40 and the bottom surface 11a1 of the concave part 11a, adhesive having high heat conductivity is preferable. For example, the adhesive can be set as adhesive in which a filler using an inorganic material is mixed. It is preferable that the inorganic material is set as a material (for example, ceramics such as aluminum oxide and aluminum nitride) having high heat conductivity. For example, the heat conductivity of the adhesive can be set to 0.5 to 10 W/(m·K).

In addition, the heat transfer part 40 can be embedded in the bottom surface 11a1 of the concave part 11a by an insert molding method. In addition, the heat transfer part 40 can also be attached on the bottom surface 11a1 of the concave part 11a through a layer formed from heat conductive grease (thermal radiation grease). There is no particular limitation to the kind of the heat conductive grease, but for example, the heat conductive grease can be set as grease obtained by mixing a filler using a material (for example, ceramics such as aluminum oxide and aluminum nitride) having high heat conductivity, for example, in modified silicone. For example, the heat conductivity of the heat conductive grease can be set to 1 to 5 W/(m·K).

The heat transfer part 40 is provided in order for heat generated in the light-emitting module 20 to be easily transferred to the socket 10. Accordingly, it is preferable that the heat transfer part 40 is formed from a material having high heat conductivity. The heat transfer part 40 has a plate shape, and can be formed from, for example, a metal such as aluminum, an aluminum alloy, copper, and a copper alloy.

Note that, when heat generated in the light-emitting module 20 is less, the heat transfer part 40 can also be omitted.

As illustrated in FIG. 2 and FIG. 3, for example, the light-emitting module 20 includes a board 21, a light-emitting element 22, a frame part 23, a sealing part 24, an element 25, an optical element 26, and a trap 27.

The board 21 is provided on one end side of the socket 10. For example, the board 21 can be bonded onto the heat transfer part 40. In this case, it is preferable that adhesive is set as adhesive having high heat conductivity. For example, the adhesive can be the same as the adhesive that bonds the heat transfer part 40 and the bottom surface 11a1 of the concave part 11a described above.

The board 21 has a plate shape. For example, a planar shape of the board 21 can be set to a quadrangle. For example, the board 21 can be formed from an inorganic material such as ceramics (for example, aluminum oxide, aluminum nitride, and the like), an organic material such as paper phenol and glass epoxy, or the like. In addition, the board 21 may be a member obtained by coating a surface of a metal plate with an insulating material. When the amount of heat generation in the light-emitting element 22 is large, from the viewpoint of thermal radiation, it is preferable that the board 21 is formed by using a material with high heat conductivity. Examples of the material having high heat conductivity include ceramics such as aluminum oxide and aluminum nitride, a highly heat conductive resin, a member obtained by coating a surface of a metal plate with an insulating material, and the like. In addition, the board 21 may have a single-layer structure, or a multi-layer structure.

A wiring pattern 21a is provided on a surface of the board 21 (refer to FIG. 1). For example, the wiring pattern 21a can be formed from a material containing silver as a main component, a material containing copper as a main component, or the like. The wiring pattern 21a is provided with a plurality of connection pads 21a1 for soldering the power-supply terminal 31, and a plurality of mounting pads 21a2 for mounting the light-emitting element 22 or the element 25.

In addition, a covering part that covers the wiring pattern 21a, a film-shaped resistor to be described later, or the like can also be provided. For example, the covering part can contain a glass material.

The light-emitting element 22 is provided on a side of the board 21 which is opposite to the bottom surface 11a1 side of the concave part 11a. The light-emitting element 22 is provided on the board 21. The light-emitting element 22 is electrically connected to the wiring pattern 21a. For example, the light-emitting element 22 is mounted on each of the mounting pads 21a2. At least one piece of the light-emitting element 22 can be provided. When providing a plurality of the light-emitting elements 22, the plurality of light-emitting elements 22 can be connected in series.

For example, each of the light-emitting elements 22 can be set as a light-emitting diode, an organic light-emitting diode, a laser diode, or the like.

The light-emitting elements 22 can be set as a chip-shaped light-emitting element. The chip-shaped light-emitting element 22 can be mounted on the mounting pad 21a2 by chip on board (COB). In this configuration, a lot of light-emitting elements 22 can be provided in a narrow region. Accordingly, a reduction in size of the light-emitting module 20, and a reduction in size of the vehicle luminaire 1 can be realized. For example, the chip-shaped light-emitting element 22 can be set as an upper electrode type light-emitting element, a vertical electrode type light-emitting element, a flip chip type light-emitting element, or the like. The light-emitting element 22 illustrated in FIG. 1 to FIG. 3 is the vertical electrode type light-emitting element. An electrode of the upper electrode type light-emitting element, or an upper electrode of the vertical electrode type light-emitting element can be electrically connected to the mounting pad 21a2 by a wiring 21b. In this case, the wiring 21b can be connected, for example, by a wire bonding method. The flip chip type light-emitting element 22 can be directly mounted on the mounting pad 21a2.

The number, the size, the arrangement, and the like of the light-emitting element 22 are not limited to exemplified configurations, and can be appropriately changed in correspondence with the size, the use, or the like of the vehicle luminaire 1.

The frame part 23 is provided on a side of the board 21 which is opposite to the bottom surface 11a1 side of the concave part 11a. The frame part 23 has a frame shape, and is bonded onto the board 21. The frame part 23 surrounds the light-emitting element 22. The frame part 23 can be formed from a resin. Examples of the resin include thermoplastic resins such as polybutylene terephthalate (PBT), polycarbonate (PC), PET, nylon, polypropylene (PP), polyethylene (PE), and polystyrene (PS).

The frame part 23 can have a function of defining a formation range of the sealing part 24, and a function as a reflector. Accordingly, the frame part 23 may contain particles of titanium oxide or the like, or may contain a white resin to improve reflectance. In addition, an inner surface of the frame part 23 can be set as an inclined surface. For example, the inner surface of the frame part 23 can be inclined in a direction away from a central axis of the frame part 23 as being spaced from the board 21.

The sealing part 24 can be provided on an inner side of the frame part 23. The sealing part 24 can be provided to cover a region surrounded by the frame part 23. The sealing part 24 can be provided to cover the light-emitting element 22. The sealing part 24 can contain a resin having translucency. For example, the sealing part 24 can be formed by filling an inner side of the frame part 23 with a resin. For example, filling with the resin can be performed by using a dispenser or the like. For example, the filled resin can be set as a silicone resin, or the like. In this case, when the viscosity of the filled resin is excessively low, it is difficult to suppress spreading of the resin overflowed to an outer side of the frame part 23. When the viscosity of the filled resin is excessively high, it is difficult to discharge air trapped into the inside of the resin. Accordingly, the viscosity of the filled resin is set to, for example, 1000 to 7500 mPa·s.

In addition, the sealing part 24 can contain a phosphor. For example, the phosphor can be set as a YAG-based phosphor (yttrium•aluminum•garnet-based phosphor), or the like. However, the kind of the phosphor can be appropriately changed to obtain a predetermined emission color in correspondence with the use of the vehicle luminaire 1 or the like.

The element 25 can be set as a passive element or an active element capable of being used to constitute a light-emitting circuit including the light-emitting element 22. As illustrated in FIG. 1, for example, the element 25 can be provided at the periphery of the frame part 23, and can be electrically connected to the wiring pattern 21a (mounting pad 21a2). At least one piece of the element 25 can be provided.

For example, the element 25 can be set as a resistor 25a, a control element 25b, or the like.

However, the kind of the element 25 is not limited to the exemplified elements, and can be appropriately changed in correspondence with a configuration of the light-emitting circuit including the light-emitting element 22. For example, in addition to the above-described elements, the element 25 may be a capacitor, a pull-down resistor, a positive characteristics thermistor, a negative characteristic thermistor, an inductor, a surge absorber, a varistor, a transistor such as a FET and a bipolar transistor, an integrated circuit, an arithmetic operation element, or the like.

The resistor 25a is provided on a side of the board 21 which is opposite to the bottom surface 11a1 side of the concave part 11a. The resistor 25a is provided on the board 21. The resistor 25a is electrically connected to the wiring pattern 21a. For example, the resistor 25a is mounted on the mounting pad 21a2. For example, the resistor 25a can be set as a surface mounting type resistor, a resistor (resistor coated with a metal oxide) including a lead wire, a film-shaped resistor formed by using a screen printing method or the like, or the like. Note that, the resistor 25a illustrated in FIG. 1 is the film-shaped resistor.

For example, a material of the film-shaped resistor can be set as ruthenium oxide ($RuO_2$). For example, the film-shaped resistor can be formed by using a screen printing method, and a firing method. When the resistor 25a is the film-shaped resistor, a contact area between the resistor 25a and the board 21 can be enlarged, and thus thermal radiation characteristics can be improved. In addition, a plurality of the resistors 25a can be formed at a time. Accordingly, productivity can be improved. In addition, a deviation of a resistance value in the plurality of resistors 25a can be suppressed.

Here, since a variation exists in forward voltage characteristics of the light-emitting element 22, when an application voltage between an anode terminal and a ground terminal is made constant, a variation occurs in brightness (luminous flux, luminance, luminous intensity, illuminance) of light emitted from the light-emitting element 22. Accordingly, a value of a current flowing through the light-emitting element 22 is made to be within a predetermined range by the resistors 25a connected to the light-emitting element 22 in series so that brightness of light emitted from the light-emitting element 22 is within a predetermined range. In this case, the value of the current flowing through the light-emitting element 22 is made to be within a predetermined range by causing the resistance value of each of the resistors 25a to vary.

When the resistor 25a is the surface mounting type resistor, the resistor including the lead wire, or the like, a resistor 25a having an appropriate resistance value in correspondence with the forward voltage characteristics of the light-emitting element 22 can be selected. When the resistor 25a is the film-shaped resistor, if removing a part of the resistor 25a, the resistance value can be increased. For example, a part of the film-shaped resistor can be easily removed by irradiating the film-shaped resistor with laser light. Note that, the number, a size, and the like of the resistor 25a are not limited to the exemplification, and can be appropriately changed in correspondence with the number, specifications, and the like of the light-emitting element 22.

The control element 25b is provided on a side of the board 21 which is opposite to the bottom surface 11a1 side of the concave part 11a. The control element 25b is provided on the board 21. For example, the control element 25b is mounted on the mounting pad 21a2. For example, the control element 25b can be provided to prevent a reverse voltage from being applied to the light-emitting element 22, and to prevent a pulse noise from a reverse direction from being applied to the light-emitting element 22. For example, the control element 25b can be set as a diode. For example, the control element 25b can be set as a surface mounting type diode, a diode including a lead wire, or the like. The control element 25b illustrated in FIG. 1 is the surface mounting type diode.

The optical element 26 can be formed from a light-transmissive material. For example, the optical element 26 can be formed from a light-transmissive resin such as a silicone resin, glass, or the like. For example, the optical element 26 can be formed by a molding method, or the like.

As illustrated in FIG. 2 and FIG. 3, the optical element 26 is provided on the sealing part 24. The optical element 26 can be bonded to at least any one of an end face 24a of the sealing part 24 which is opposite to the board 21 side, and an end face 23a of the frame part 23 which is opposite to the board 21 side. For example, the optical element 26 can be bonded to at least any one of the end face 24a of the sealing part 24 and the end face 23a of the frame part 23 by curing the filled resin inside the frame part 23.

For example, the optical element 26 carries out diffusion, condensing, or the like of light emitted from the light-emitting element 22. The optical element 26 illustrated in FIG. 2 and FIG. 3 is a convex lens. The optical element 26 that is the convex lens condenses light to obtain predetermined light distribution characteristics. Note that, the optical element 26 is not limited to the convex lens, and may be, for example, a concave lens or the like.

Figure 4:
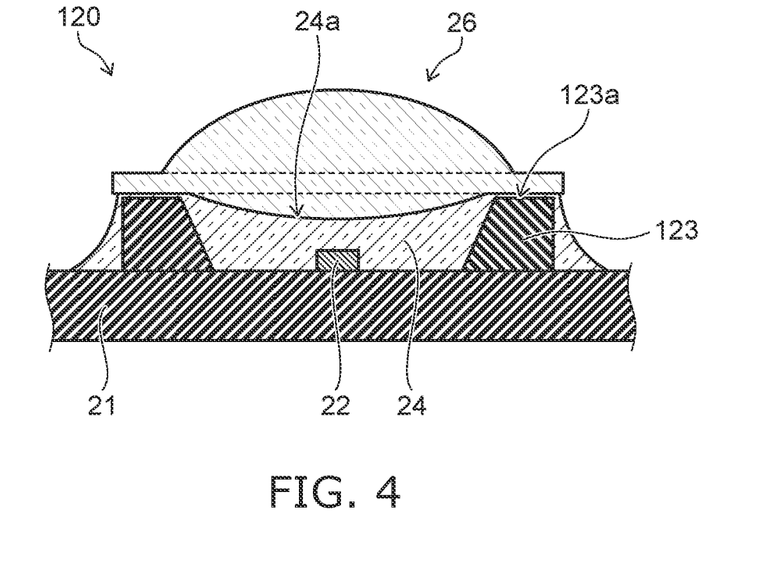
FIG. 4 is a schematic cross-sectional view of a light-emitting module according to a comparative example.

FIG. 4 is a schematic cross-sectional view of a light-emitting module 120 according to a comparative example.

Note that, in FIG. 4, only the board 21, the light-emitting element 22, a frame part 123, the sealing part 24, and the optical element 26 are illustrated to avoid complexity.

The frame part 23 is provided in the above-described light-emitting module 20, but the frame part 123 is provided in the light-emitting module 120 according to the comparative example as illustrated in FIG. 4.

The optical element 26 is provided on the sealing part 24. For example, an inner side of the frame part 123 is filled with a resin, and the optical element 26 is placed on the filled resin. The filled resin is cured to form the sealing part 24, and the optical element 26 is bonded to at least any one of the end face 24a of the sealing part 24 and an end face 123a of the frame part 123.

Here, when the optical element 26 is placed on the resin, a gas such as the air may be trapped between the optical element 26 and the resin. When the resin is cured in a state in which the gas is trapped, there is a concern that a gas-containing layer, a void (air bubble), or the like may occur between the sealing part 24 and the optical element 26, or inside the sealing part 24. When the gas-containing layer, the void, or the like exists, there is a concern that light emitted from the light-emitting element 22 is reflected from the gas-containing layer or an interface of the void or the like, and light extracting efficiency may decrease.

In this case, when placing the optical element 26 on the resin, if the resin is caused to overflow to an outer side of the frame part 123, the gas trapped between the optical element 26 and the resin can be discharged in combination with the resin. In order to suppress occurrence of the gas-containing layer, the void, or the like, it is preferable to increase the amount of the resin overflowed to the outer side of the frame part 123.

By the way, the resin overflowed to the outer side the frame part 123 has a certain degree of fluidity, and thus the overflowed resin flows on the board 21, and there is a concern that the resin adheres to, for example, the connection pad 21a1 provided in the wiring pattern 21a. Since the power-supply terminals 31 are soldered to the connection pad 21a1, when the resin adheres to the connection pad 21a1, it is difficult to solder the power-supply terminals 31 to the connection pad 21a1.

In recent years, a reduction in size of the light-emitting module, and a reduction in size of the vehicle luminaire 1 are desired. Accordingly, a distance between the frame part 123 and the connection pad 21a1 is shortened, and the resin is likely to adhere to the connection pad 21a1. In this case, when decreasing the amount of the resin that overflows to the outer side of the frame part 123, the resin is less likely to adhere to the connection pad 21a1, but it is difficult to suppress occurrence of the gas-containing layer, the void, or the like.

Here, the light-emitting module according to this embodiment is provided with a trap that is provided in at least one of an outer surface of the frame part, and the vicinity of a peripheral edge of the optical element, and retains at least a part of the resin overflowed to the outer side of the frame part.

For example, as illustrated in FIG. 3, the trap 27 has a concave shape, and can be opened to the outer surface 23b of the frame part 23. In this case, the trap 27 can also be opened to the end face 23a of the frame part 23. For example, the trap 27 can have an annular shape along the outer surface 23b of the frame part 23. In addition, for example, a plurality of the traps 27 can also be provided along the outer surface 23b of the frame part 23. In this case, in the traps 27 having the annular shape, retention of the overflowed resin becomes easy.

When the trap 27 is provided, since at least a part of the resin overflowed to the outer side of the frame part 23 can be retained, the amount of the resin reaching at least the board 21 can be reduced. Accordingly, even when increasing the amount of the resin overflowing to the outer side of the frame part 23 to suppress occurrence of the gas-containing layer, the void, or the like, the resin is less likely to reach the connection pad 21a1. That is, when the trap 27 is provided, it is possible to suppress the resin having fluidity from spreading to an unintended region on the board 21.

FIGS. 5A to 5F are schematic cross-sectional views illustrating traps 27a to 27f according to another embodiment.

Figure 5A:
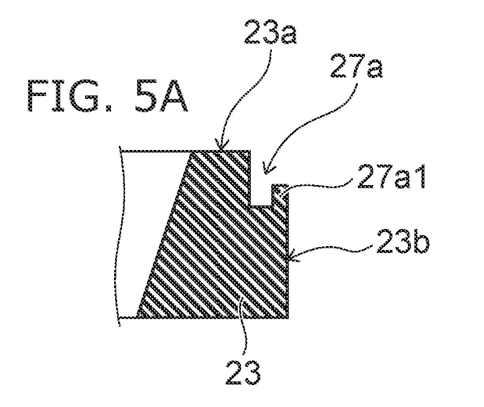
FIGS. 5A to 5F are schematic cross-sectional views illustrating traps according to another embodiment.

As illustrated in FIG. 5A, the trap 27a is opened to the outer surface 23b of the frame part 23 and the end face 23a of the frame part 23. A jaw 27a1 is provided in the trap 27a on the outer surface 23b side of the frame part 23. When the jaw 27a1 is provided, the resin flowed into the inside of the trap 27a can be suppressed from flowing out to the outer surface 23b side of the frame part 23.

Figure 5B:
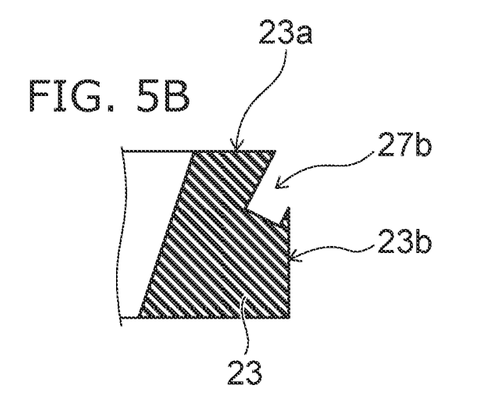
Figure 5C:
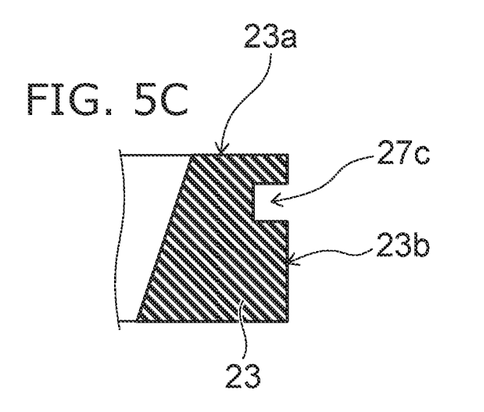

As illustrated in FIG. 5B, the trap 27b is opened to the outer surface 23b of the frame part 23 and the end face 23a of the frame part 23. The trap 27b is inclined with respect to the end face 23a of the frame part 23. For example, the trap 27b can be inclined to a direction away from the central axis of the frame part 23 as going toward the end face 23a side of the frame part 23. In this case, the resin flowed into the inside of the trap 27b can be suppressed from flowing out to the outer surface 23b side of the frame part 23. In addition, the resin overflowed to the outer side of the frame part 23 flows to the board 21 side along the outer surface 23b of the frame part 23. Accordingly, when an inner wall of the trap 27b on the end face 23a side is inclined, it is easy to cause the resin to flow into the inside of the trap 27b.

In addition, as illustrated in FIGS. 5C to 5F, the traps 27c to 27f may be opened to the outer surface 23b of the frame part 23, and may not be opened to the end face 23a of the frame part 23. That is, the traps may be opened to at least the outer surface 23b of the frame part 23. The resin overflowed to the outer side of the frame part 23 flows to the board 21 side along the outer surface 23b of the frame part 23, and thus when the traps are opened to the outer surface 23b of the frame part 23, it is possible to cause the resin to flow into the inside of the traps. However, in the case of a trap opened to the outer surface 23b of the frame part 23 and the end face 23a of the frame part 23, it is easy to cause the resin to flow into the inside of the trap. On the other hand, when a trap is not opened to the end face 23a of the frame part 23, an area of the end face 23a can be enlarged, and thus joining strength between the frame part 23 and the sealing part 24 can be increased.

Figure 5D:
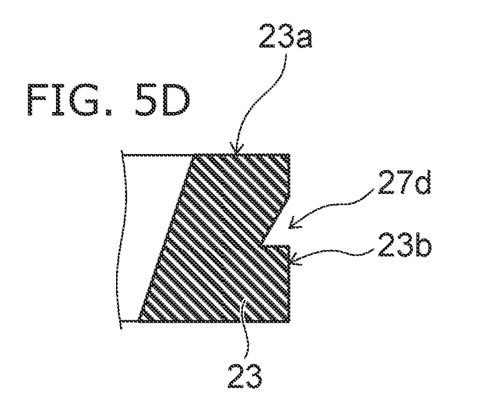
Figure 5E:
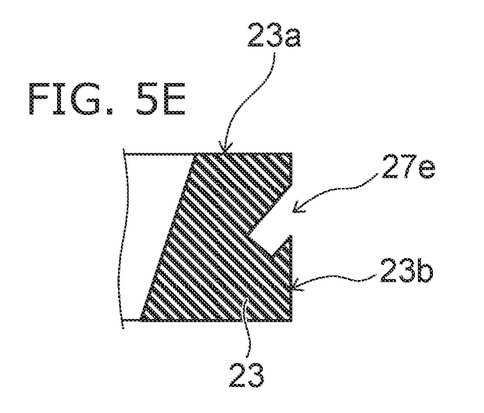

In addition, description has been given of a case where a cross-sectional shape of the trap is a quadrangle, but the cross-sectional shape of the trap can be appropriately changed. For example, as illustrated in FIG. 5D, the cross-sectional shape of the trap 27d may be set to a triangle. The resin overflowed to the outer side of the frame part 23 flows to the board 21 side along the outer surface 23b of the frame part 23, and thus when an inner wall of the trap 27d on the end face 23a side is inclined, it is easy to cause the resin to flow into the inside of the trap 27d.

Figure 5F:
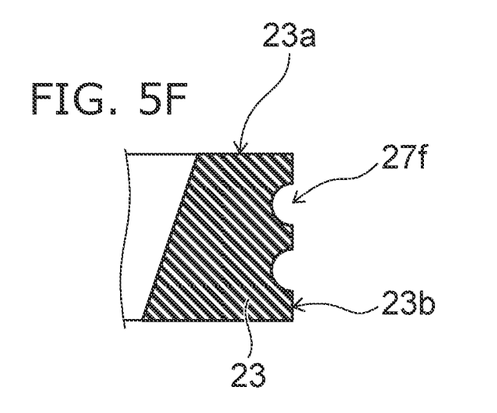

For example, as illustrated in FIG. 5F, the cross-sectional shape of the trap 27f may be set as a part of a circle or an ellipse. In addition, as illustrated in FIG. 5F, a plurality of traps can also be provided along the central axis of the frame part 23. In addition, a trap that is opened to the outer surface 23b of the frame part 23 and the end face 23a of the frame part 23, and a trap that is opened to the outer surface 23b of the frame part 23, and is not opened to the end face 23a of the frame part 23 can also be provided.

Figure 6:
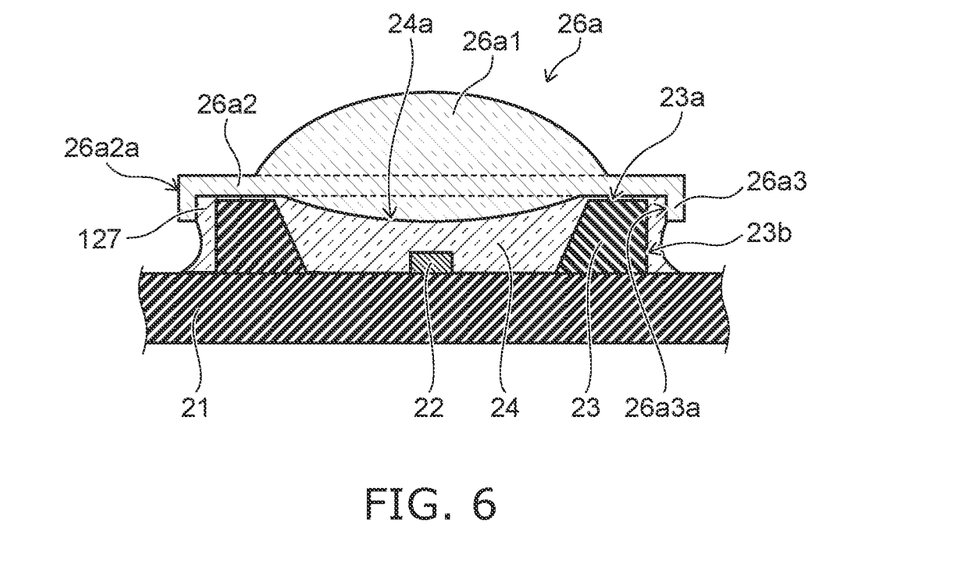
FIG. 6 is a schematic cross-sectional view illustrating a trap according to still another embodiment.

FIG. 6 is a schematic cross-sectional view illustrating a trap 127 according to still another embodiment.

As illustrated in FIG. 6, for example, an optical element 26a includes an optical portion 26a1, a flange portion 26a2, and a convex portion 26a3. The optical portion 26a1, the flange portion 26a2, and the convex portion 26a3 can be integrally formed.

The optical portion 26a1 is provided on the sealing part 24. Light emitted from the light-emitting element 22 is incident to the optical portion 26a1. The optical portion 26a1 illustrated in FIG. 6 can be set as a convex lens.

For example, the flange portion 26a2 has an annular shape. The flange portion 26a2 is provided to surround a peripheral edge of the optical portion 26a1. An outer surface 26a2a of the flange portion 26a2 is located on an outer side of the frame part 23.

For example, the convex portion 26a3 has an annular shape. The convex portion 26a3 is provided in the vicinity of a peripheral edge of the flange portion 26a2, and protrudes to the board 21 side.

A gap is provided between an inner surface 26a3a of the convex portion 26a3 and the outer surface 23b of the frame part 23. When the gap is provided between the inner surface 26a3a of the convex portion 26a3 and the outer surface 23b of the frame part 23, the resin overflowed to the outer side of the frame part 23 can be retained by a capillary force. Accordingly, the gap can be set as the trap 127. That is, the trap 127 is provided between the inner surface 26a3a of the convex portion 26a3 and the outer surface 23b of the frame part 23. In this case, when enlarging a gap dimension S, the capillary force decreases, and thus the amount of the resin capable of being retained decreases. When reducing the gap dimension S, a volume of a portion that retains the resin decreases, and thus the amount of the resin capable of being retained decreases. According to the finding obtained by the present inventors, the gap dimension S is preferably set to 0.1 to 0.5 mm.

When the trap 127 is provided, at least a part of the resin overflowed to the outer side of the frame part 23 can be retained, and thus the amount of the resin reaching at least the board 21 can be reduced. According to this, even when suppressing occurrence of the gas-containing layer, the void, or the like by increasing the amount of the resin overflowing to the outer side of the frame part 23, the resin is less likely to reach the connection pad 21a1. That is, when the trap 127 is provided, it is possible to suppress the resin having fluidity from spreading to an unintended region on the board 21.

In addition, the trap 127 and the traps (for example, the above-described traps 27, and 27a to 27f) provided in the above-described frame part 23 may be provided.

Here, when manufacturing the light-emitting module 20, the inner side of the frame part 23 is filled with the resin having translucency, the optical element 26 is placed on the resin, and the resin is heated to be cured, thereby performing formation of the sealing part 24 and joining of the optical element 26. A material of the frame part 23, a material of the optical element 26, and a material of the sealing part 24 are different from each other, and thus thermal stress occurs when heating and curing the resin. In addition, when lighting the light-emitting element 22, heat is generated, and thus the sealing part 24 is heated, and thermal stress occurs. In the case of the vehicle luminaire 1, lighting and extinction are repetitively performed, and thus the thermal stress repetitively occurs.

Figure 7:
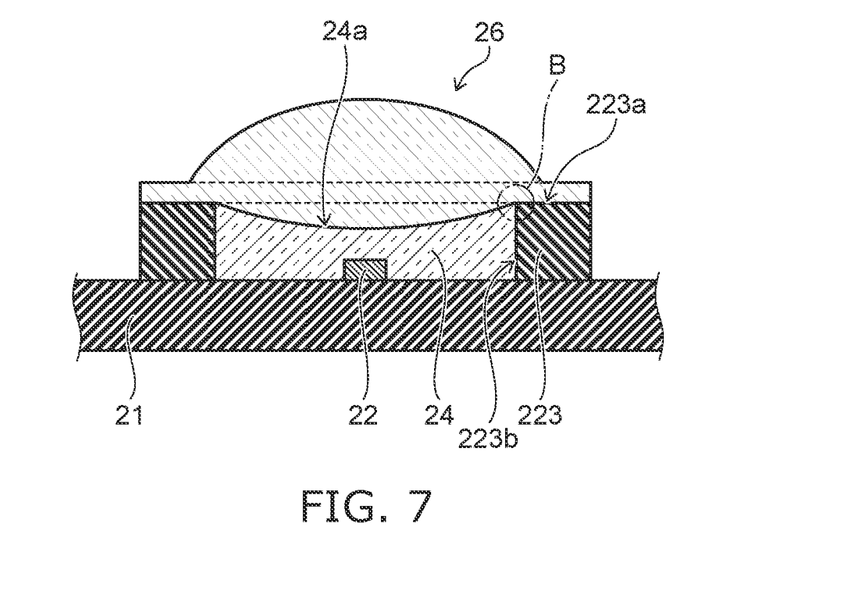
FIG. 7 is a schematic cross-sectional view illustrating a frame part according to another comparative example.

FIG. 7 is a schematic cross-sectional view illustrating a frame part 223 according to another comparative example.

As illustrated in FIG. 7, the frame part 223 has a tubular shape. An upper end face 223a and an inner surface 223b of the frame part 223 are orthogonal to each other. In addition, the optical element 26 is joined to the upper end face 223a of the frame part 223. According to this, as illustrated in a portion B in FIG. 7, a peripheral edge of the upper end face 24a of the sealing part 24 has a sharp angle, and thus when thermal stress occurs, stress concentration is likely to occur. When manufacturing a light-emitting module, during use of a vehicle luminaire, or the like, if stress concentration occurs in the vicinity of the peripheral edge of the upper end face 24a of the sealing part 24, a damage such as cracks and peeling-off may occur in the vicinity of the peripheral edge of the upper end face 24a. When the damage such as cracks and peeling-off occurs, a layer that contains a gas such as the air, a void, or the like may occur. When the gas-containing layer, the void, or the like exists, there is a concern that light emitted from the light-emitting element 22 is reflected from the gas-containing layer or an interface of the void or the like, optical characteristics such as light extracting efficiency may vary.

Figure 8:
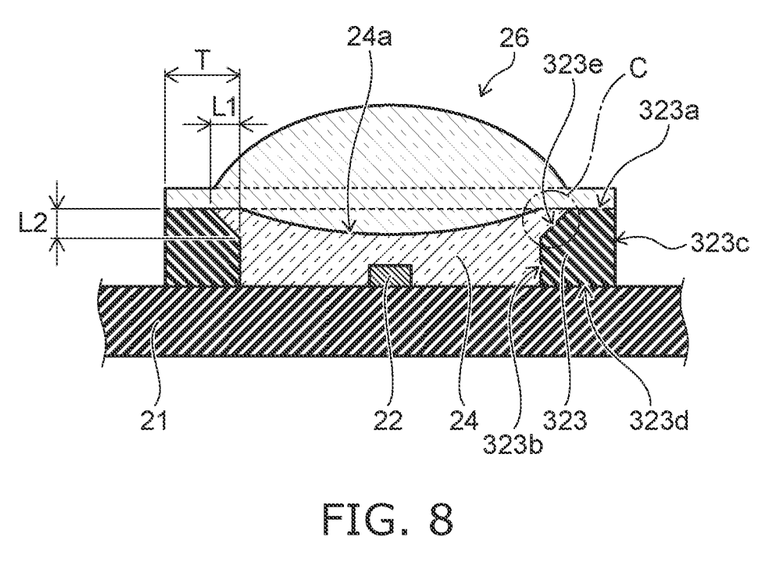
FIG. 8 is a schematic cross-sectional view illustrating a frame part according to this embodiment.

FIG. 8 is a schematic cross-sectional view illustrating a frame part 323 according to still another embodiment.

As illustrated in FIG. 8, a shape of the frame part 323 can be set as a tubular shape. Note that, the shape of the frame part 323 illustrated in FIG. 8 is a cylindrical shape.

The frame part 323 includes an upper end face 323a, a lower end face 323d opposite to the upper end face 323a, an inner surface 323b, and an outer surface 323c opposite to the inner surface 323b. For example, the lower end face 323d can be set to be approximately parallel to the upper end face 323a. For example, the lower end face 323d can be bonded to the board 21.

A distance (thickness) T (mm) between the inner surface 323b and the outer surface 323c of the frame part 323 is preferably set to 0.6 mm or less. When T is 0.6 mm or less, a reduction in size of the light-emitting module 20 can be realized. In addition, since the rigidity of the frame part 323 is not significantly reduced, when manufacturing a light-emitting module, during use of a vehicle luminaire, or the like, the frame part 323 can be suppressed from being broken.

In addition, as illustrated in a portion C in FIG. 8, the frame part 323 further includes an inclined surface 323e. For example, the frame part 323 includes the inclined surface 323e provided in an edge of an opening which is opposite to the board 21 side. For example, the inclined surface 323e intersects the upper end face 323a and the inner surface 323b. For example, one end of the inclined surface 323e is connected to the upper end face 323a. For example, the other end of the inclined surface 323e is connected to the inner surface 323b.

In a direction orthogonal to a surface of the board 21 on which the frame part 323 is provided, a distance between the optical element 26 and the inclined surface 323e decreases as going to an outer side of the frame part 323. The vicinity of a peripheral edge of the upper end face 24a (end face opposite to the board 21 side) of the sealing part 24 is provided between the inclined surface 323e and the optical element 26. According to this, a dimension of the sealing part 24, which is provided between the inclined surface 323e and the optical element 26, in a direction orthogonal to the board 21 gradually decreases. That is, the thickness of the sealing part 24 in the vicinity of the peripheral edge of the upper end face 24a can be suppressed from suddenly decreasing.

According to this, when thermal stress occurs, stress concentration can be suppressed from occurring, and thus a damage such as cracks and peeling-off can be suppressed from occurring in the vicinity of the peripheral edge of the upper end face 24a. That is, the damage can be suppressed from occurring in the sealing part 24 in the vicinity of the edge of the opening of the frame part 323 which is opposite to the board 21 side.

According to the finding obtained by the present inventors, as illustrated in FIG. 8, in a direction parallel to a surface of the board 21 on which the frame part 323 is provided, it is preferable that a distance L1 (mm) between an inner end of the inclined surface 323e and an outer end of the inclined surface 323e is set to 0.2 to 0.5 mm. In the direction orthogonal to the surface of the board 21 on which the frame part 323 is provided, it is preferable that a distance L2 (mm) between an end of the inclined surface 323e which is close to the board 21, and an end of the inclined surface 323e which is far away from the board 21 is set to 0.2 to 0.5 mm. In this configuration, the damage can be more effectively suppressed from occurring in the sealing part 24.

Figure 9A:
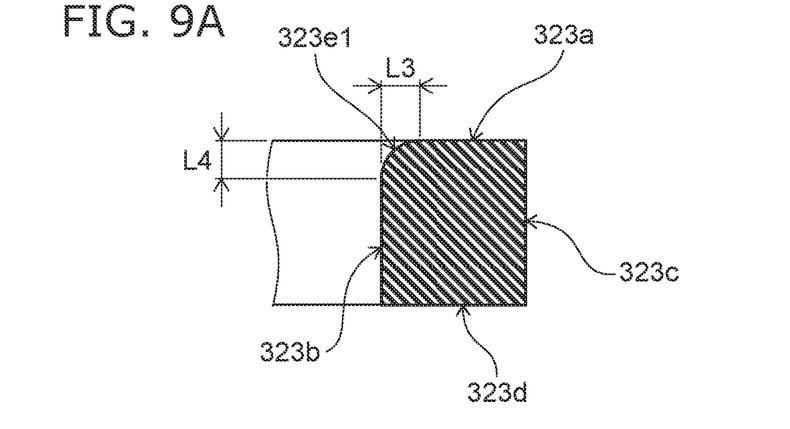
FIGS. 9A to 9C are schematic cross-sectional views illustrating an inclined surface according to still another embodiment.
Figure 9B:
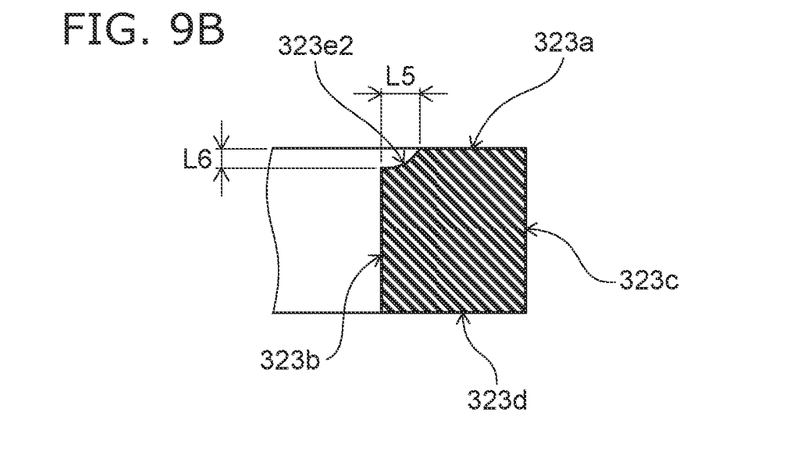
Figure 9C:
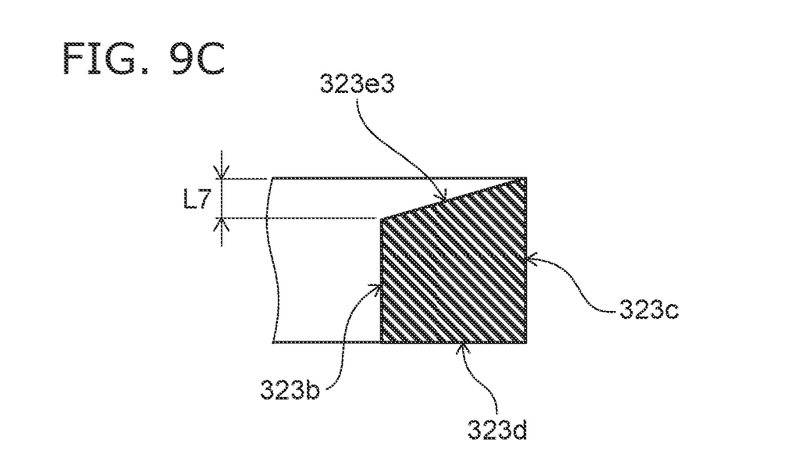

FIGS. 9A to 9C are schematic cross-sectional views illustrating an inclined surface according to still another embodiment.

The inclined surface 323e illustrated in FIG. 8 can be set as a flat surface. In contrast, an inclined surface 323e1 illustrated in FIG. 9A can be set as a convex curved surface. In this case, in the direction parallel to the surface of the board 21 on which the frame part 323 is provided, it is preferable that a distance L3 (mm) between an inner end of the inclined surface 323e1 and an outer end of the inclined surface 323e1 is set to 0.2 to 0.5 mm. In the direction orthogonal to the surface of the board 21 on which the frame part 323 is provided, it is preferable that a distance L4 (mm) between an end of the inclined surface 323e1 which is close to the board 21, and an end of the inclined surface 323e1 which is far away from the board 21 is set to 0.2 to 0.5 mm.

In addition, an inclined surface 323e2 illustrated in FIG. 9B can be set as a concave curved surface. In this case, in the direction parallel to the surface of the board 21 on which the frame part 323 is provided, it is preferable that a distance L5 (mm) between an inner end of the inclined surface 323e2 and an outer end of the inclined surface 323e2 is set to 0.2 to 0.5 mm. In the direction orthogonal to the surface of the board 21 on which the frame part 323 is provided, it is preferable that a distance L6 (mm) between an end of the inclined surface 323e2 which is close to the board 21, and an end of the inclined surface 323e2 which is far away from the board 21 is set to 0.2 to 0.5 mm.

In addition, as illustrated in FIG. 9C, an inclined surface 323e3 can also be provided instead of the upper end face 323a. In this case, one end of the inclined surface 323e3 is connected to the outer surface 323c. The other end of the inclined surface 323e3 is connected to the inner surface 323b. In this case, in the direction orthogonal to the surface of the board 21 on which the frame part 323 is provided, it is preferable that a distance L7 (mm) between an end of the inclined surface 323e3 which is close to the board 21, and an end of the inclined surface 323e3 which is far away from the board 21 is set to 0.2 to 0.5 mm. Note that, in FIG. 9C, the inclined surface 323e3 is set as a flat surface, but the inclined surface 323e3 can also be set as a convex curved surface or a concave curved surface.

In addition, the above-described aspects of the inclined surfaces may be combined.

That is, each of the inclined surfaces may include at least any one of the flat surface, the convex curved surface, and the concave curved surface.

Even in the above-described inclined surfaces, it is possible to suppress the thickness of the sealing part 24 in the vicinity of the peripheral edge of the upper end face 24a from suddenly decreasing. Accordingly, the same effect as in the above-described inclined surface 323e can be exhibited.

In addition, the above-described traps 27 and 27a to 27f, the trap 127, and the inclined surfaces 323e, 323e1, 323e2, and 323e3 may be appropriately combined.

For example, when the above-described trap 27, 27a to 27f, or 127, and the inclined surface 323e, 323e1, 323e2, or 323e3 are provided, the resin having fluidity is suppressed from spreading to an unintended region on the board, and a damage is suppressed from occurring in the sealing part.

Vehicle Lighting Tool

Next, the vehicle lighting tool 100 will be described.

Note that, in the following description, as an example, description will be given of a case where the vehicle lighting tool 100 is the front combination light that is provided in automobiles. However, the vehicle lighting tool 100 is not limited to the front combination light that is provided in automobiles. The vehicle lighting tool 100 may be a vehicle lighting tool that is provided in automobiles, railway vehicles, or the like.

Figure 10:
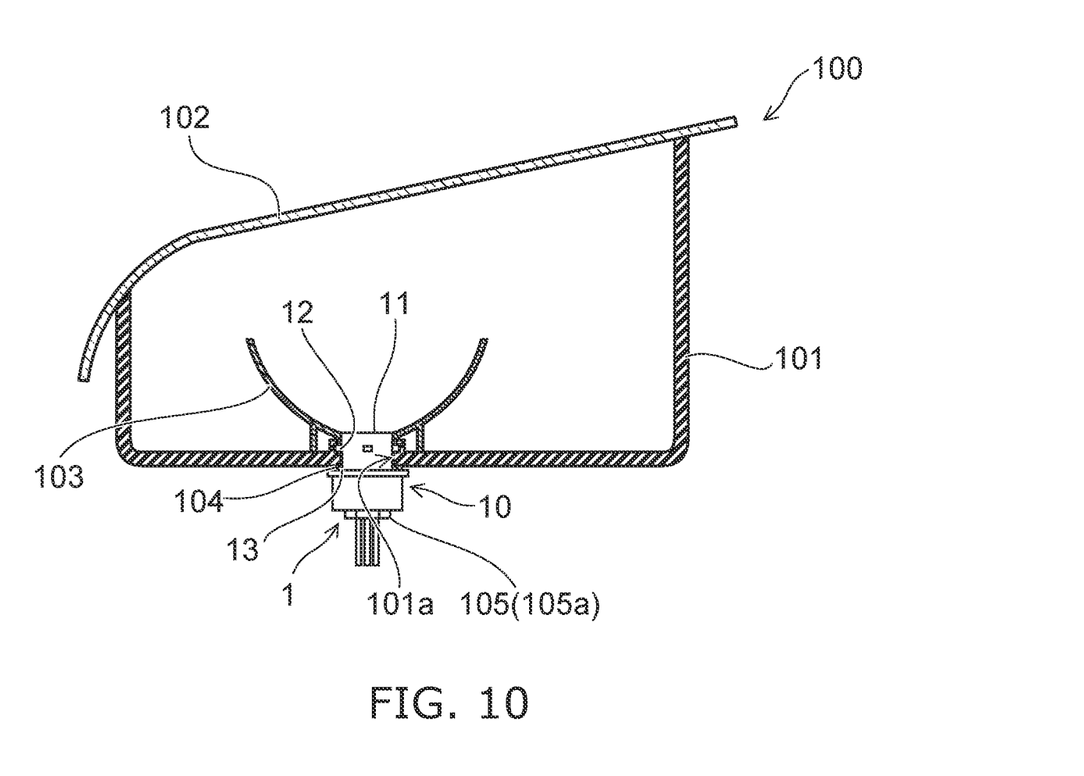
FIG. 10 is a schematic partial cross-sectional view illustrating a vehicle lighting tool.

FIG. 10 is a schematic partial cross-sectional view illustrating the vehicle lighting tool 100.

As illustrated in FIG. 10, for example, the vehicle luminaire 1, the housing 101, a cover 102, an optical element part 103, a sealing member 104, and the connector 105 are provided in the vehicle lighting tool 100.

The vehicle luminaire 1 is attached to the housing 101. The housing 101 holds the mounting part 11. The housing 101 has a box shape in which one end side is opened. For example, the housing 101 can be formed from a resin or the like through which light is not transmitted. An attachment hole 101a, into which a portion of the mounting part 11 where the bayonet 12 is provided is inserted, is provided in a bottom surface of the housing 101. A concave part, into which the bayonet 12 provided in the mounting part 11 is inserted, is provided in a peripheral edge of the attachment hole 101a. Note that, description has been given of a case where the attachment hole 101a is directly provided in the housing 101, but an attaching member including the attachment hole 101a may be provided in the housing 101.

When attaching the vehicle luminaire 1 to the vehicle lighting tool 100, the portion of the mounting part 11 where the bayonet 12 is provided is inserted into the attachment hole 101a, and the vehicle luminaire 1 is rotated. In this case, the bayonet 12 is held to a fitting portion provided in the peripheral edge of the attachment hole 101a. This attachment method is referred to as twist-lock.

The cover 102 is provided to cover an opening of the housing 101. The cover 102 can be formed from a resin or the like having translucency. The cover 102 can also have a function of a lens or the like.

Light emitted from the vehicle luminaire 1 is incident to the optical element part 103. The optical element part 103 carries out reflection, diffusion, guiding, condensing, formation of a predetermined luminous intensity distribution pattern, and the like with respect to the light emitted from the vehicle luminaire 1. For example, the optical element part 103 illustrated in FIG. 10 is a reflector. In this case, the optical element part 103 reflects the light emitted from the vehicle luminaire 1 to form a predetermined luminous intensity distribution pattern.

The sealing member 104 is provided between the flange 13 and the housing 101. The sealing member 104 can be set to have an annular shape. The sealing member 104 can be formed from a material such as a rubber and a silicone resin which have elasticity.

The connector 105 is fitted to ends of the plurality of power-supply terminals 31 which are exposed to the inside of the connector holder 15. The connector 105 is electrically connected to a power supply or the like. In addition, a sealing member 105*a* having an annular shape is provided in the connector 105. When the connector 105 is inserted into the inside of the connector holder 15, the inside of the connector holder 15 is water-tightly sealed by the sealing member 105*a*.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:
1. A vehicle luminaire comprising:
a socket;
a board provided on one end side of the socket;
at least one light-emitting element provided on the board;
a frame part provided on the board to surround the light-emitting element;
a sealing part that is provided on an inner side of the frame part and contains a resin; and
an optical element provided on the sealing part,
the frame part including:
  a first side surface and a second side surface which intersect an end face of the frame part on the board side, the first side surface being farther from a central axis of the frame part than the second side surface,
  a trap provided on the first side surface to retain at least a part of the resin overflowed to an outer side of the frame part,
the trap having a concave shape, the trap being opened to the first side surface of the frame part, and the trap being not opened to the second side surface of the frame part.
2. The luminaire according to claim 1,
wherein the trap is further opened to an end face of the frame part which is opposite to the board side.
3. The luminaire according to claim 2,
wherein the trap has an annular shape along the first side surface of the frame part.
4. The luminaire according to claim 2,
wherein a plurality of the traps are provided along the outer first side surface of the frame part.
5. The luminaire according to claim 2,
wherein a jaw is provided in the trap on the first side surface side of the frame part.
6. The luminaire according to claim 2,
wherein the trap is inclined with respect to the end face of the frame part which is opposite to the board side.
7. The luminaire according to claim 6,
wherein the trap is inclined in a direction away from a central axis of the frame part as going toward the end face of the frame part which is opposite to the board side.
8. The luminaire according to claim 1,
wherein the trap is not opened to an end face of the frame part which is opposite to the board side.
9. The luminaire according to claim 8,
wherein the trap has an annular shape along the first side surface of the frame part.
10. The luminaire according to claim 8,
wherein a plurality of the traps are provided along the first side surface of the frame part.
11. The luminaire according to claim 8,
wherein a jaw is provided in the trap on the outer first side surface side of the frame part.
12. The luminaire according to claim 8,
wherein the trap is inclined with respect to the end face of the frame part which is opposite to the board side.
13. The luminaire according to claim 12,
wherein the trap is inclined in a direction away from the central axis of the frame part as going toward the end face of the frame part which is opposite to the board side.
14. A vehicle lighting tool comprising:
the vehicle luminaire according to claim 1; and
a housing to which the vehicle luminaire is attached.

* * * * *